US010211164B2

(12) United States Patent
Kim et al.

(10) Patent No.: US 10,211,164 B2
(45) Date of Patent: Feb. 19, 2019

(54) SEMICONDUCTOR PACKAGE MANUFACTURING METHOD

(71) Applicant: DISCO CORPORATION, Tokyo (JP)

(72) Inventors: Youngsuk Kim, Tokyo (JP); Byeongdeck Jang, Tokyo (JP); Fumio Uchida, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/845,803

(22) Filed: Dec. 18, 2017

(65) Prior Publication Data

US 2018/0182715 A1  Jun. 28, 2018

(30) Foreign Application Priority Data

Dec. 28, 2016 (JP) ................................. 2016-255911

(51) Int. Cl.
*H01L 21/78* (2006.01)
*H01L 23/552* (2006.01)
(Continued)

(52) U.S. Cl.
CPC ........ *H01L 23/552* (2013.01); *H01L 21/4853* (2013.01); *H01L 21/561* (2013.01); *H01L 21/565* (2013.01); *H01L 21/568* (2013.01); *H01L 21/78* (2013.01); *H01L 23/3114* (2013.01); *H01L 23/49816* (2013.01); *H01L 23/49838* (2013.01); *H01L 24/16* (2013.01); *H01L 24/48* (2013.01); *H01L 24/97* (2013.01); *H01L 2224/16227* (2013.01);
(Continued)

(58) Field of Classification Search
None
See application file for complete search history.

(56) References Cited

U.S. PATENT DOCUMENTS

2009/0075428 A1   3/2009  Tang et al.
2012/0039164 A1   2/2012  Enyedi et al.
(Continued)

FOREIGN PATENT DOCUMENTS

JP   2012-039104    2/2012
JP   2012039164 A   2/2012

OTHER PUBLICATIONS

Kim, Youngsuk, U.S. Appl. No. 15/721,118, filed Sep. 29, 2017.
Kim, Youngsuk, U.S. Appl. No. 15/988,903, filed May 24, 2018.

*Primary Examiner* — Bradley K Smith
(74) *Attorney, Agent, or Firm* — Greer Burns & Crain, Ltd.

(57) ABSTRACT

A plurality of semiconductor packages are manufactured by a method that includes the steps of bonding a plurality of semiconductor chips on the front side of a wiring substrate, next supplying a sealing compound to the front side of the wiring substrate to form a resin layer from the sealing component on the front side of the wiring substrate, thereby forming a sealed substrate including the wiring substrate and the resin layer covering the semiconductor chips, next cutting the sealed substrate from the resin layer side by using a V blade to thereby form a V groove along each division line, next dividing the wiring substrate along each V groove to obtain a plurality of individual bare packages, and finally forming an electromagnetic shield layer on the upper surface and an inclined side surface of each bare package, thereby obtaining the plural semiconductor packages.

3 Claims, 10 Drawing Sheets

(51) Int. Cl.
*H01L 21/48* (2006.01)
*H01L 21/56* (2006.01)
*H01L 23/31* (2006.01)
*H01L 23/498* (2006.01)
*H01L 23/00* (2006.01)

(52) U.S. Cl.
CPC ........... *H01L 2224/48091* (2013.01); *H01L 2224/48227* (2013.01); *H01L 2224/95001* (2013.01); *H01L 2224/97* (2013.01); *H01L 2924/10253* (2013.01); *H01L 2924/10329* (2013.01); *H01L 2924/15159* (2013.01); *H01L 2924/15311* (2013.01); *H01L 2924/181* (2013.01); *H01L 2924/3025* (2013.01)

(56) References Cited

U.S. PATENT DOCUMENTS

2015/0303075 A1* 10/2015 Han .................. H01L 23/49805
  438/113
2018/0096948 A1* 4/2018 Kim .................... B23K 26/402

* cited by examiner

SEMICONDUCTOR PACKAGE MANUFACTURING METHOD

BACKGROUND OF THE INVENTION

Field of the Invention

The present invention relates to a semiconductor package manufacturing method for manufacturing a plurality of semiconductor packages each having a shield function.

Description of the Related Art

In general, a semiconductor package to be used in mobile communication equipment such as mobile phone is required to suppress the leakage of electromagnetic noise from the semiconductor package. A known semiconductor package has a configuration such that a semiconductor chip mounted on a wiring substrate is sealed with resin (sealing compound) to form a resin layer on the wiring substrate, thus forming a bare package, and a shield layer is formed on the outer surface of the resin layer (see Japanese Patent Laid-Open No. 2012-039104, for example). The shield layer may be formed from a sheet metal shield. However, in this case, the thickness of the shield layer is large, so that this large thickness may cause hindrance to a reduction in size and thickness of equipment. To cope with this problem, there has been proposed a technique of forming a thin shield layer by any film deposition method such as sputtering, spray coating, chemical vapor deposition (CVD), ink jet printing, and screen printing.

SUMMARY OF THE INVENTION

However, in the semiconductor package described in Japanese Patent Laid-Open No. 2012-039104, the side surface of the bare package is substantially perpendicular to the upper surface thereof. Accordingly, it is difficult to form a shield layer having a uniform thickness on the upper surface and the side surface of the bare package. Further, in the above-mentioned film deposition method such as sputtering for forming the shield layer, a conductive material for the shield layer is deposited in a direction perpendicular to the upper surface of the bare package, so that much time is required to form the shield layer on the side surface of the bare package.

It is therefore an object of the present invention to provide a semiconductor package manufacturing method which can efficiently form a shield layer having a predetermined thickness on the side surface of a bare package.

In accordance with an aspect of the present invention, there is provided a semiconductor package manufacturing method for manufacturing a plurality of semiconductor packages, including a chip bonding step of bonding a plurality of semiconductor chips to a plurality of separate regions on the front side of a wiring substrate, the separate regions being defined by a plurality of crossing division lines; a sealed substrate forming step of supplying a sealing compound to the front side of the wiring substrate after performing the chip bonding step, thereby forming a resin layer from the sealing compound on the front side of the wiring substrate to obtain a sealed substrate including the wiring substrate and the resin layer, in which the semiconductor chips are sealed; a V groove forming step of holding the wiring substrate of the sealed substrate on a holding jig after performing the sealed substrate forming step, and next cutting the sealed substrate along each division line by using a processing tool to a depth from the upper surface of the resin layer to the half of the thickness of the wiring substrate, thereby forming a V groove on the front side of the sealed substrate along each division line, the V groove having a side surface inclined with respect to a vertical direction so as to extend from the upper surface of the resin layer to the bottom of the V groove; a dividing step of dividing the wiring substrate along each V groove after performing the V groove forming step, thereby dividing the sealed substrate along each division line to obtain a plurality of individual bare packages; and a shield layer forming step of forming an electromagnetic shield layer on the upper surface and the inclined side surface of each bare package after performing the dividing step, thereby obtaining the plurality of semiconductor packages.

With this configuration, the sealed substrate is cut from the resin layer side by using the processing tool, thereby forming the V groove on the front side of the sealed substrate. Accordingly, the side surface of each bare package obtained by the dividing step is inclined so as to be reverse-tapered from the upper surface of the resin layer to the bottom of each bare package. As viewed in plan, the inclined side surface of each bare package has a projected area, so that the electromagnetic shield layer can be easily formed on the side surface of each bare package by depositing a conductive material in a direction perpendicular to the upper surface of each bare package. Accordingly, the electromagnetic shield layer can be efficiently formed on the upper surface and the side surface of each bare package so as to have a predetermined thickness capable of exhibiting a sufficient shield effect.

Preferably, the semiconductor package manufacturing method further includes a bump forming step of forming bumps on the back side of the wiring substrate between the V groove forming step and the dividing step; the resin layer of the sealed substrate being held on a holding jig under suction in the dividing step.

Preferably, the semiconductor package manufacturing method further includes a wiring substrate groove forming step of forming a groove on the front side of the wiring substrate along each division line before performing the sealed substrate forming step, the groove having a depth from the upper surface of the wiring substrate to the half of the thickness of the wiring substrate; the sealed substrate being formed in the condition where each groove of the wiring substrate is filled with the sealing compound in the sealed substrate forming step; the resin layer formed from the sealing compound filling each groove of the wiring substrate being processed by the processing tool to thereby form each V groove in the V groove forming step.

According to the present invention, the side surface of each bare package is inclined so as to be reverse-tapered toward the bottom of each bare package, so that a shield layer having a predetermined thickness can be efficiently formed on the side surface of each bare package.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
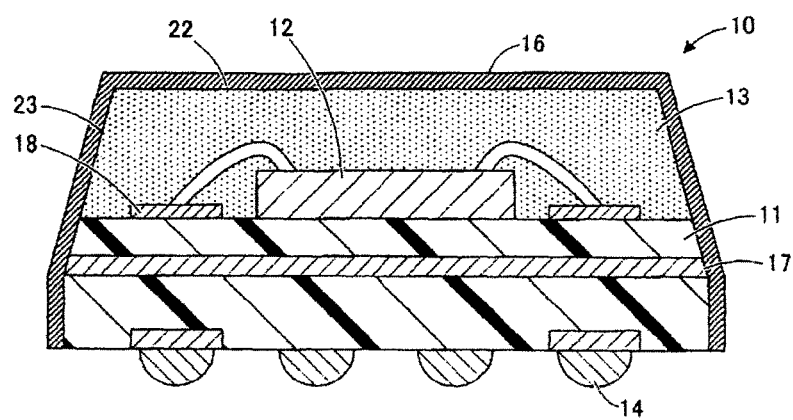
FIG. 1 is a schematic sectional view of a semiconductor package manufactured by the semiconductor package manufacturing method according to the present invention.
Figure 2A:
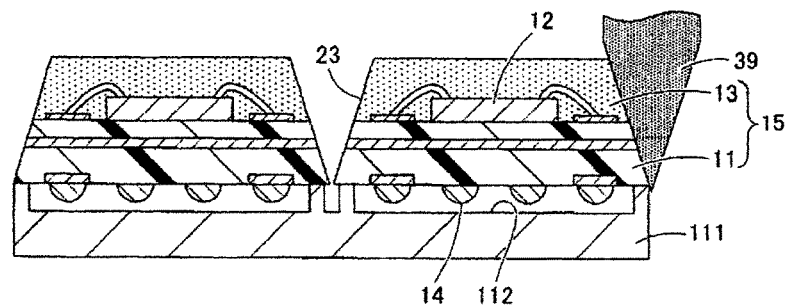
FIGS. 2A and 2B are schematic sectional views depicting semiconductor package manufacturing methods in the prior art as comparisons.
Figure 2B:
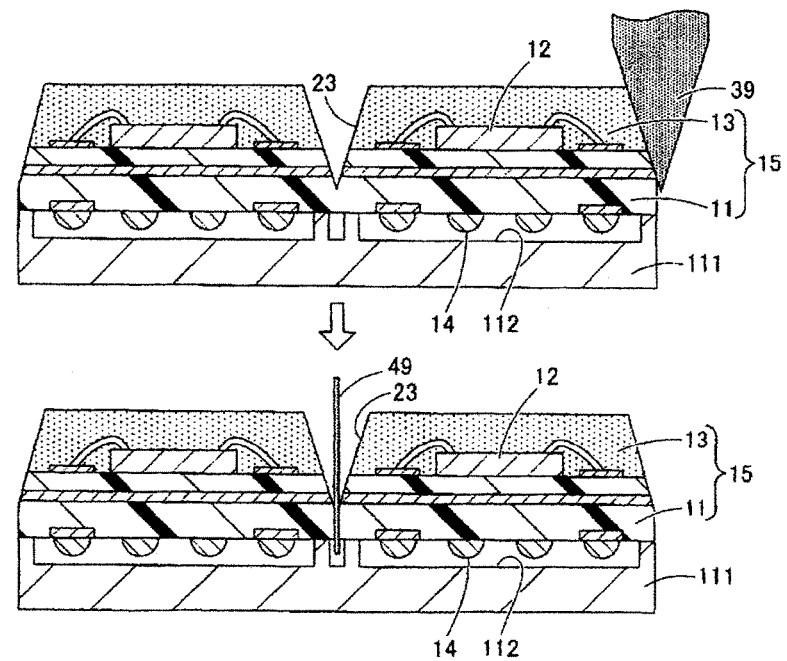

A semiconductor package manufacturing method according to preferred embodiments of the present invention will now be described with reference to the attached drawings. FIG. 1 is a schematic sectional view of a semiconductor package manufactured by the method according to this preferred embodiment. FIGS. 2A and 2B are schematic sectional views depicting semiconductor package manufacturing methods in the prior art as comparisons. The following preferred embodiment is merely illustrative. For example, a certain step may be interposed between the adjacent steps of the manufacturing method or the order of the steps of the manufacturing method may be changed.

Referring to FIG. 1, there is depicted a semiconductor package 10 having an electromagnetic shield layer 16 forming an outer surface. The semiconductor package 10 is a packaged semiconductor device required to have an electromagnetic shielding function against so-called electromagnetic interference (EMI). That is, the electromagnetic shield layer 16 functions to suppress the leakage of electromagnetic noise from the semiconductor package 10 to the outside thereof. A semiconductor chip 12 is mounted on the upper surface (front side) of a wiring substrate (interposer substrate) 11. The semiconductor chip 12 is sealed with a resin layer (sealing compound) 13. The resin layer 13 is surrounded by the electromagnetic shield layer 16. Further, bumps 14 are provided on the lower surface (back side) of the wiring substrate 11. The wiring substrate 11 is formed with a lot of wiring including electrodes 18 and a ground line 17. The electrodes 18 are connected through wires to the semiconductor chip 12.

The semiconductor chip 12 is formed by dividing a semiconductor wafer having a semiconductor substrate of silicon, gallium arsenide, etc. and a plurality of devices formed on the semiconductor substrate, wherein the semiconductor wafer is divided into a plurality of semiconductor chips having the devices. The semiconductor chip 12 is bonded through the wires 19 wires to the wiring substrate 11. The semiconductor package 10 has an upper surface 22 and a side surface 23 extending downward from the upper surface 22, wherein the side surface 23 is inclined so as to be reverse-tapered toward the bottom of the semiconductor package 10. The electromagnetic shield layer 16 is formed by sputtering, for example, from the upper side of the semiconductor package 10 to the upper surface 22 as a horizontal surface and the side surface 23 as an inclined surface. Unlike a general semiconductor package having a vertical side surface, the side surface 23 of the semiconductor package 10 is inclined so as to obliquely intersect the direction (vertical direction) of film deposition for the electromagnetic shield layer 16, so that the electromagnetic shield layer 16 can be easily formed.

Referring to FIG. 2A, there is depicted a conventional semiconductor package manufacturing method as a first comparison, wherein a plurality of semiconductor chips 12 are mounted on a wiring substrate 11 and sealed with a resin layer 13 to form a sealed substrate 15, and the sealed substrate 15 is fully cut by using a cutting blade 39 having a V-shaped tip (which will be hereinafter referred to as "V blade") to thereby form the inclined side surface 23 of each semiconductor package 10 (see FIG. 1). Although this manufacturing method can simply manufacture the semiconductor packages 10, it is necessary to use a holding jig 111 for supporting the semiconductor packages 10 in dividing the sealed substrate 15, wherein the holding jig 111 has a plurality of recesses 112 for accommodating the bumps 14. Accordingly, the holding jig 111 must be newly designed. While the bumps 14 may be provided after dividing the sealed substrate 15, there is a possibility of displacement of the bumps 14 with respect to each package.

Further, since the wiring substrate 11 includes a lot of wiring (metal) as described above, the V blade 39 is greatly worn in cutting the wiring substrate 11, so that the V-shaped tip of the V blade 39 is easily broken. FIG. 2B depicts a second comparison intended to solve this problem, wherein the sealed substrate 15 is divided by step cutting using the V blade 39 and a usual cutting blade 49. With this configuration, the amount of cutting of the wiring substrate 11 by the V blade 39 can be reduced to thereby suppress the wearing of the V-shaped tip of the V blade 39. However, the holding jig 111 must yet be newly designed in this method.

In the semiconductor package manufacturing method according to a first preferred embodiment, the sealed substrate 15 is half cut by using the V blade 39 prior to providing the bumps 14 on the sealed substrate 15. With this configuration, a holding jig 36 (see FIG. 3C) having no recesses for accommodating the bumps 14 can be used. That is, the sealed substrate 15 can be held by using the existing holding jig 36. Further, since the sealed substrate 15 is not fully cut by the V blade 39, the bumps 14 can be provided on the sealed substrate 15 without displacement, and the amount of cutting of the wiring substrate 11 by the V blade 39 can be reduced to thereby suppress the wearing of the V-shaped tip of the V blade 39.

Figure 3A:
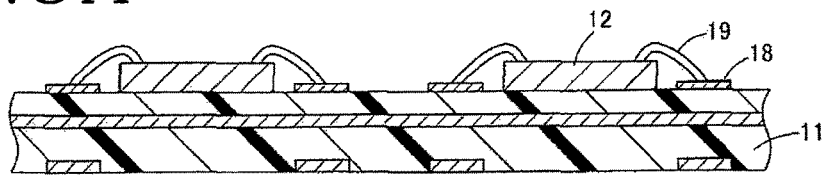
FIGS. 3A to 3C are schematic sectional views depicting a semiconductor package manufacturing method according to a first preferred embodiment of the present invention.
Figure 3B:
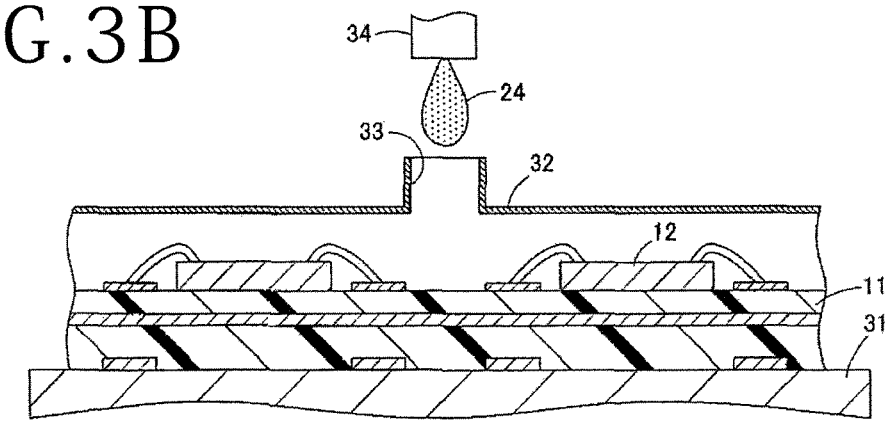
Figure 3C:
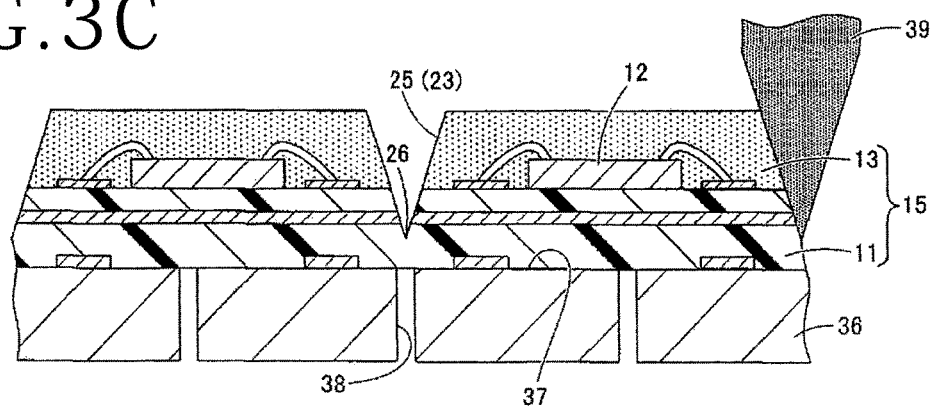
Figure 3D:
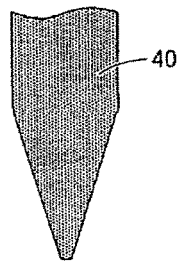
FIG. 3D is a sectional view of a cutting blade as a modification.
Figure 4A:
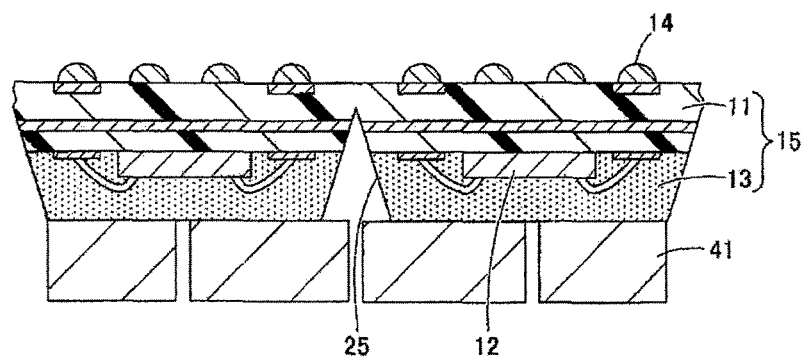
FIGS. 4A to 4C are schematic sectional views depicting the semiconductor package manufacturing method according to the first preferred embodiment to be performed subsequent to the step depicted in FIG. 3C.
Figure 4B:
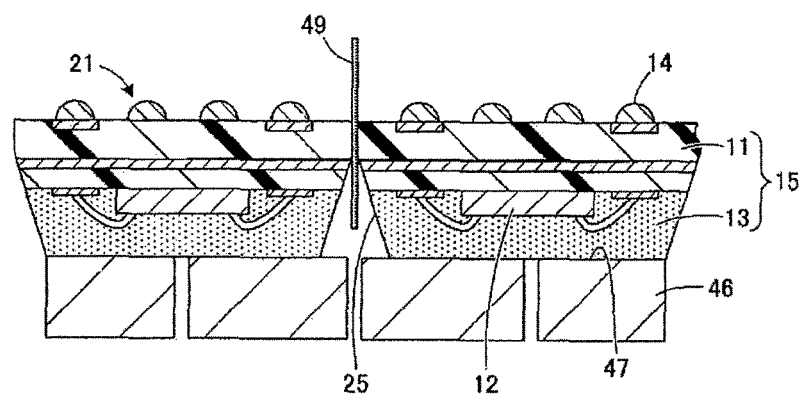
Figure 4C:
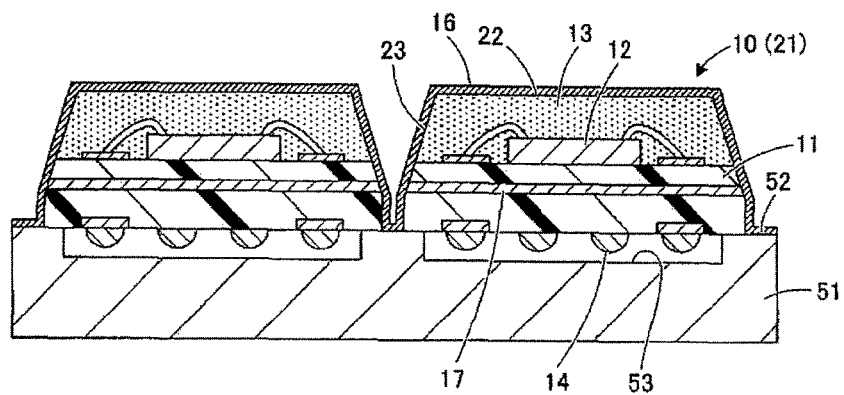

The semiconductor package manufacturing method according to this first preferred embodiment will now be described with reference to FIGS. 3A to 3D and FIGS. 4A to 4C. FIGS. 3A to 3D and FIGS. 4A to 4C are sectional views for illustrating the semiconductor package manufacturing method according to the first preferred embodiment. FIG. 3A depicts a chip bonding step, FIG. 3B depicts a sealed substrate forming step, FIG. 3C depicts a V groove forming step, and FIG. 3D depicts a modification of the V blade 39. FIG. 4A depicts a bump forming step, FIG. 4B depicts a dividing step, and FIG. 4C depicts a shield layer forming step.

As depicted in FIG. 3A, the chip bonding step is first performed. In the chip bonding step, a plurality of semiconductor chips 12 are bonded to a plurality of separate regions defined by a plurality of crossing division lines set on the upper surface (front side) of the wiring substrate 11. More specifically, the electrodes (not depicted) formed on the upper surface of each semiconductor chip 12 are bonded through the wires 19 to the electrodes 18 formed on the upper surface of the wiring substrate 11. That is, one end of each wire 19 is connected to each electrode of the semiconductor chip 12, and the other end of each wire 19 is connected to each electrode 18 of the wiring substrate 11. While such wire bonding is performed in the chip bonding step in this preferred embodiment, flip chip bonding may be performed instead. In the flip chip bonding, the electrodes formed on the lower surface of each semiconductor chip 12 are directly connected to the electrodes formed on the upper surface of the wiring substrate 11.

As depicted in FIG. 3B, the sealed substrate forming step is performed after performing the chip bonding step. In the sealed substrate forming step, a sealing compound 24 is supplied to the upper surface of the wiring substrate 11 to which the plural semiconductor chips 12 have been bonded, thereby sealing the semiconductor chips 12 with the sealing compound 24 to form a sealed substrate 15 (see FIG. 3C). More specifically, the lower surface (back side) of the wiring substrate 11 is held by a holding jig 31 for sealing, and a mold 32 is set so as to cover the upper surface of the wiring substrate 11. The mold 32 has an upper wall formed with an inlet opening 33, and a nozzle 34 for supplying the sealing compound 24 is positioned directly above the inlet opening 33.

In operation, the sealing compound 24 is supplied from the nozzle 34 through the inlet opening 33 to the upper surface of the wiring substrate 11 until the inside space of the mold 32 is filled with the sealing compound 24, thereby sealing the semiconductor chips 12 with the sealing compound 24. Thereafter, the sealing compound 24 is heated or dried to be cured, thereby forming a resin layer 13 (see FIG. 3C) on the upper surface of the wiring substrate 11. Thus, the sealed substrate 15 includes the wiring substrate 11 and the resin layer 13, in which the plural semiconductor chips 12 are sealed. The sealing compound 24 is a curable liquid resin. Examples of the curable liquid resin include epoxy resin, silicone resin, urethane resin, unsaturated polyester resin, acrylic urethane resin, and polyimide resin. While the sealing compound 24 is a liquid resin in this preferred embodiment, a sheet resin or a powder resin may be used instead. In this manner, the plural semiconductor chips 12 mounted on the wiring substrate 11 can be sealed collectively.

After forming the sealed substrate 15, the upper surface of the sealed substrate 15 (i.e., the upper surface of the resin layer 13 (see FIG. 3C)) may be planarized by grinding. By using a grinding apparatus (not depicted) to grind the upper surface of the sealed substrate 15, the thickness of the resin layer 13 covering the semiconductor chips 12 can be adjusted to a desired thickness. Thus, a planarizing step may be performed after performing the sealed substrate forming step.

As depicted in FIG. 3C, the V groove forming step is performed after performing the sealed substrate forming step. In the V groove forming step, the wiring substrate 11 of the sealed substrate 15 is held by a holding jig 36 for V groove formation. Thereafter, the sealed substrate 15 is cut by using the V blade 39 (processing tool) having a V-shaped tip to a depth from the upper surface of the resin layer 13 to the half of the thickness of the wiring substrate 11, thereby forming a V groove 25 along each division line. The holding jig 36 has a holding surface 37 for holding the lower surface of the sealed substrate 15. The holding surface 37 of the holding jig 36 is formed with a plurality of crossing escape grooves 38 corresponding to the division lines. Accordingly, the holding surface 37 is partitioned by the plural escape grooves 38 to define a plurality of separate regions, each of which is formed with a suction opening (not depicted). Each suction opening is connected through a suction passage to a vacuum source. Accordingly, a vacuum is produced at each suction opening to hold the sealed substrate 15 on the holding surface 37 of the holding jig 36 under suction.

The V blade 39 is aligned with a target one of the division lines of the sealed substrate 15 at a position outside the sealed substrate 15 before cutting. The V blade 39 is a disk-shaped cutting blade having a V-shaped tip and it is mounted on a spindle (not depicted) at its front end. The V blade 39 is formed by bonding diamond abrasive grains with a bond. The V blade 39 is lowered to the depth from the upper surface of the resin layer 13 to the half of the thickness of the wiring substrate 11 at the position outside the sealed substrate 15, and the sealed substrate 15 is fed in a horizontal direction relative to the V blade 39. As a result, the sealed substrate 15 is half cut along the target division line to form the V groove 25 having the side surface 23 inclined so as to extend from the upper surface of the resin layer 13 to the bottom 26 of the V groove 25.

After forming the V groove 25 along the target division line, the V blade 39 is aligned with the next division line adjacent to the above target division line to similarly half cut the sealed substrate 15 along this next division line. This half cutting operation is repeated along all of the other division lines to form a plurality of similar V grooves 25 on the upper surface of the sealed substrate 15 along all of the other division lines. In this manner, the sealed substrate 15 is half cut to form the V grooves 25 prior to providing the bumps 14 (see FIG. 4A). Accordingly, the sealed substrate 15 can be held by the existing holding jig 36 in forming the V grooves 25. That is, it is unnecessary to newly design a holding jig having recesses for accommodating the bumps 14 as in the comparisons mentioned above.

While the V-shaped tip of the V blade 39 is pointed in this preferred embodiment, the V-shaped tip of the V blade 39 is not limited. That is, it is only necessary that the V-shaped tip of the V blade 39 can form the V groove 25 on the sealed substrate 15. For example, FIG. 3D depicts a cutting blade 40 as a modification of the V blade 39. The cutting blade 40 is a V blade having a V-shaped tip with a flat end. That is, the V-shaped tip of the V groove 40 depicted in FIG. 3D is not pointed. Thus, the V-shaped tip of the V blade in the present invention is not limited to a completely V-shaped tip having a pointed end, but also includes a substantially V-shaped tip having a flat end. Further, the V-shaped tip of the V blade may be slightly rounded rather than formed by flat inclined surfaces.

As depicted in FIG. 4A, the bump forming step is performed after performing the V groove forming step. In the bump forming step, the bumps 14 are formed on the back side of the wiring substrate 11. More specifically, the sealed substrate 15 depicted in FIG. 3C is inverted and the resin layer 13 of the sealed substrate 15 is held on a holding jig 41 for bump formation under suction. In this condition, the back side of the wiring substrate 11 is exposed upward and the bumps 14 are provided on the exposed back side of the wiring substrate 11. The bumps 14 function as terminals or electrodes in mounting each semiconductor package 10 (see FIG. 4C) on various substrates. The bumps 14 are formed at predetermined positions according to the wiring patterns of the wiring substrate 11. Since the bumps 14 are formed prior to dividing the sealed substrate 15, possible displacement of the bumps 14 with respect to the sealed substrate 15 can be prevented.

As depicted in FIG. 4B, the dividing step is performed after performing the bump forming step. In the dividing step, the wiring substrate 11 is divided along each V groove 25 to obtain a plurality of individual bare packages 21 divided along each division line. More specifically, the resin layer 13 of the sealed substrate 15 is held under suction on a holding surface 47 of a holding jig 46 for dividing in the condition where the bumps 14 are oriented upward. A cutting blade 49 is next aligned with a target one of the division lines at a position outside the sealed substrate 15. The holding jig 46 has a configuration similar to that of the holding jig 36 for V groove formation. The cutting blade 49 is a disk-shaped blade formed by bonding diamond abrasive grains with a bond. The cutting blade 49 is mounted on a spindle (not depicted) at its front end.

Thereafter, the cutting blade 49 is lowered to a vertical position lower than the lower surface (front side) of the wiring substrate 11 at a position outside the wiring substrate 11, and the sealed substrate 15 is fed in a horizontal direction relative to the cutting blade 49. As a result, the sealed substrate 15 (i.e., the wiring substrate 11) is fully cut along the target division line where the V groove 25 is formed. After fully cutting the sealed substrate 15 along the target division line, the cutting blade 49 is aligned with the next division line adjacent to the above target division line to similarly fully cut the sealed substrate 15 along this next division line. This full cutting operation is repeated along all of the other division lines to divide the sealed substrate 15 into the individual bare packages 21. While the cutting blade 49 is worn during cutting, a vertical cut surface can be obtained because the sectional shape (thickness) of the cutting blade 49 is uniform.

As depicted in FIG. 4C, the shield layer forming step is performed after performing the dividing step. In the shield layer forming step, an electromagnetic shield layer 16 is formed on the upper surface 22 and the inclined side surface 23 of the resin layer 13 of each bare package 21. More specifically, each bare package 21 is picked up from the holding jig 46 depicted in FIG. 4B and then inverted to be held on a holding jig 51 for shielding as depicted in FIG. 4C. The holding jig 51 has a holding surface 52 for holding the lower surface (back side) of the sealed substrate 15. The holding surface 52 of the holding jig 51 is formed with a plurality of recesses 53 for accommodating the bumps 14 of the plural bare packages 21. That is, each recess 53 is so formed as to accommodate the bumps 14 of each bare package 21. The bottom surface of each recess 53 may be formed with a suction opening (not depicted) for holding each bare package 21 under suction.

Thus, the plural bare packages 21 are held on the holding surface 52 of the holding jig 51 in the condition where the resin layer 13 of each bare package 21 is exposed upward. Thereafter, a conductive material is deposited to each bare package 21 from the upper side thereof, thereby forming the electromagnetic shield layer 16 on the upper surface 22 and the side surface 23 of each bare package 21. The conductive material is metal such as copper, titanium, nickel, and gold. Selecting at least one of such metals forms a multilayer film having a thickness of several μm or more as the electromagnetic shield layer 16. The electromagnetic shield layer 16 may be formed by any method such as sputtering, ion plating, spray coating, chemical vapor deposition (CVD), ink jet printing, and screen printing. As another method, the electromagnetic shield layer 16 may be formed by a vacuum lamination method such that a metal film having the above multilayer film is bonded to the upper surface 22 and the side surface 23 of each bare package 21 in a vacuum.

The side surface 23 of each bare package 21 is inclined so as to be reverse-tapered from the upper surface 22 toward the bottom of each bare package 21. That is, the side surface 23 of each bare package 21 is inclined so as to obliquely intersect the direction (vertical direction) of film deposition for the electromagnetic shield layer 16, so that the electromagnetic shield layer 16 can be easily formed in such a manner that a conductive film having a thickness capable of exhibiting a sufficient shield effect can be deposited not only on the upper surface 22, but also on the side surface 23. Thusly, the upper surface 22 and the side surface 23 of each bare package 21 are covered with the electromagnetic shield layer 16 to manufacture each semiconductor package 10.

The electromagnetic shield layer 16 is connected to the ground line 17, so that electromagnetic noise generated in each semiconductor package 10 can be removed through the ground line 17 to the outside of the semiconductor package 10. The lower end portion below the inclined side surface 23 of each bare package 21 has a vertical surface. Accordingly, a sufficient thickness of the electromagnetic shield layer 16 cannot be ensured on this vertical surface. However, electromagnetic noise can be cut off by a lot of wiring provided in the wiring substrate 11, so that the electromagnetic noise can be sufficiently shielded also at the lower end portion below the side surface 23 of each bare package 21. Accordingly, it is possible to effectively prevent the leakage of electromagnetic noise to any peripheral electronic components about the semiconductor package 10.

In the semiconductor package manufacturing method according to the first preferred embodiment, the V groove forming step and the dividing step may be performed by using the same cutting apparatus. Further, in the case of manufacturing a semiconductor package without the bumps 14, the bump forming step may be omitted. Further, in the case that the sealed substrate 15 is previously formed, the chip bonding step and the sealed substrate forming step may be omitted.

As described above, in the semiconductor package manufacturing method according to the first preferred embodiment, the sealed substrate 15 is cut from the resin layer 13 side by using the V blade 39. Accordingly, the side surface 23 of each bare package 21 obtained by the dividing step is inclined so as to be reverse-tapered from the upper surface of the resin layer 13 to the bottom of each bare package 21. As viewed in plan, the inclined side surface 23 of each bare package 21 has a projected area, so that the electromagnetic shield layer 16 can be easily formed on the side surface 23 of each bare package 21 by depositing a conductive material in a direction perpendicular to the upper surface 22 of each bare package 21. Accordingly, the electromagnetic shield layer 16 can be efficiently formed on the upper surface 22 and the side surface 23 of each bare package 21 so as to have a predetermined thickness capable of exhibiting a sufficient shield effect.

The sealed substrate 15 includes the wiring substrate 11 and the resin layer 13 stacked on the wiring substrate 11 so as to seal the plural semiconductor chips 12, wherein the V blade 39 is worn more in cutting the wiring substrate 11, and the V blade 39 is worn less in cutting the resin layer 13. That is, in the semiconductor package manufacturing method according to the first preferred embodiment, the wiring substrate 11 and the resin layer 13 different in material from each other are cut at the same time in the V groove forming step. Accordingly, it is difficult to manage the amount of wearing of the V blade 39 and the angle of the V-shaped tip of the V blade 39. To cope with this problem, a second preferred embodiment to be described later is improved in that the wiring substrate 11 is cut to form an escape groove for avoiding the contact between the wiring substrate 11 and the V blade 39, prior to forming the sealed substrate 15, and this escape groove is filled with resin in forming the resin layer 13, so that only the resin layer 13 is cut by the V blade 39 in forming the V groove 25.

Figure 5A:
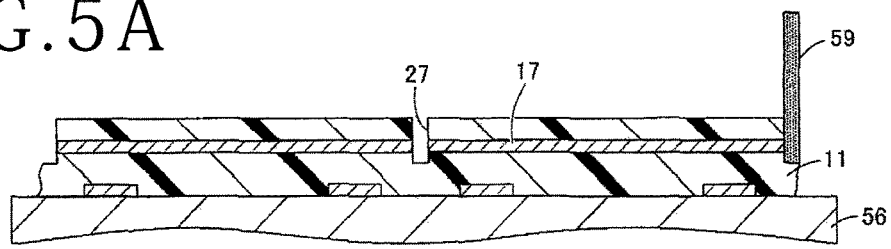
FIGS. 5A to 5D are schematic sectional views depicting a semiconductor package manufacturing method according to a second preferred embodiment of the present invention.
Figure 5B:
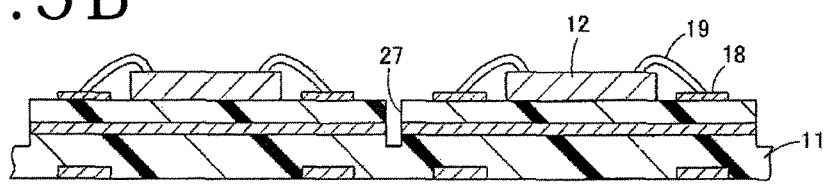
Figure 5C:
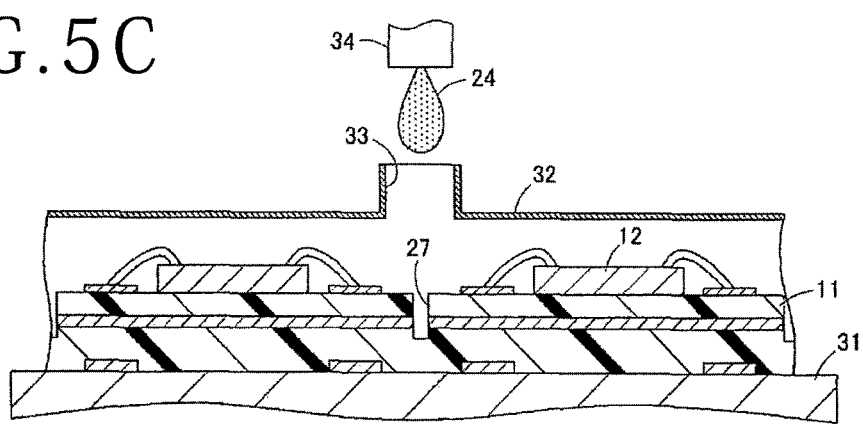
Figure 5D:
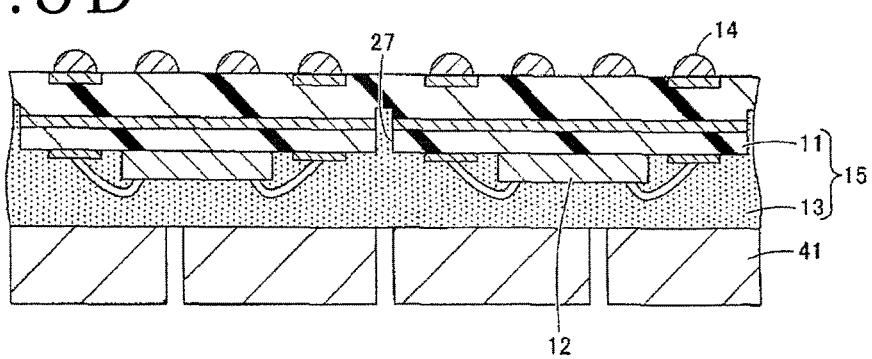
Figure 6A:
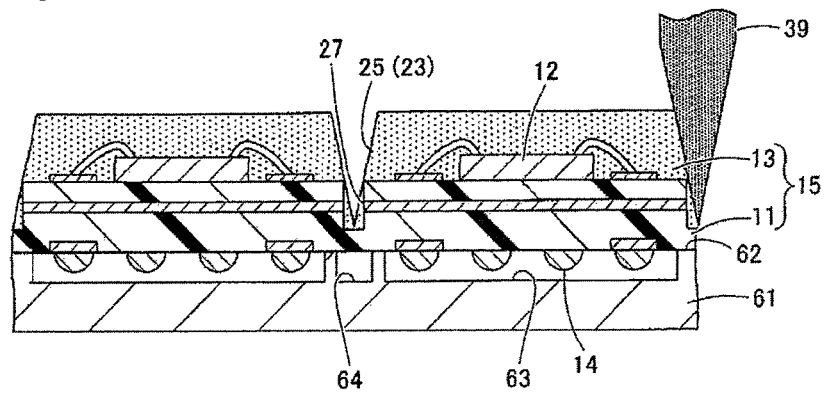
FIGS. 6A to 6C are schematic sectional views depicting the semiconductor package manufacturing method according to the second preferred embodiment to be performed subsequent to the step depicted in FIG. 5D.
Figure 6B:
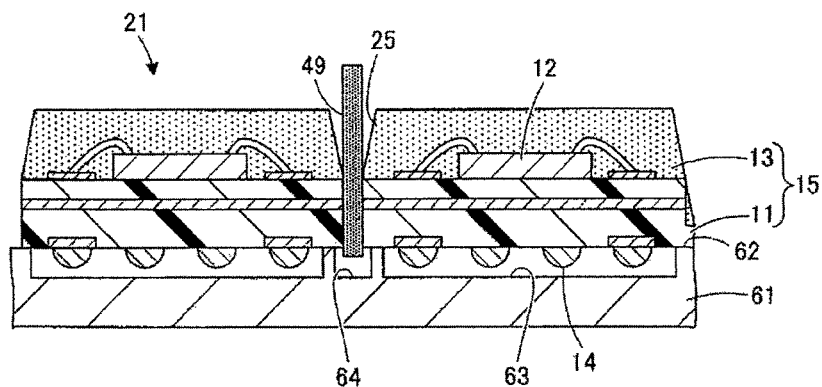
Figure 6C:
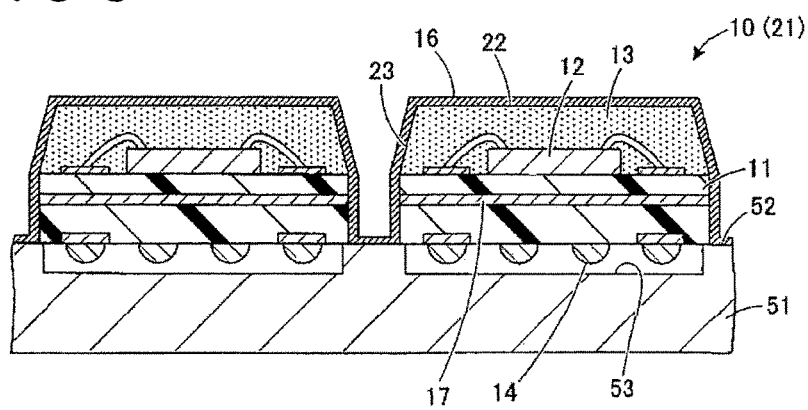

The semiconductor package manufacturing method according to this second preferred embodiment will now be described with reference to FIGS. 5A to 5D and FIGS. 6A to 6C. FIG. 5A depicts a wiring substrate groove forming step, FIG. 5B depicts a chip bonding step, FIG. 5C depicts a sealed substrate forming step, and FIG. 5D depicts a bump forming step. FIG. 6A depicts a V groove forming step, FIG. 6B depicts a dividing step, and FIG. 6C depicts a shield layer forming step. In the following description of the second preferred embodiment, the configuration similar to that of the semiconductor package manufacturing method according to the first preferred embodiment will be simply described.

As depicted in FIG. 5A, the wiring substrate groove forming step is first performed. In the wiring substrate groove forming step, a wiring substrate 11 is cut to form a groove 27 along each division line, the groove 27 having a depth from the upper surface (front side) of the wiring substrate 11 to the half of the thickness thereof, e.g., a depth such that a ground line 17 formed in the wiring substrate 11 is cut by the groove 27. More specifically, the back side of the wiring substrate 11 is held on a holding jig 56 for groove formation under suction. Thereafter, a cutting blade 59 is aligned with a target one of the division lines set on the wiring substrate 11 at a position outside the wiring substrate 11. The cutting blade 59 is a disk-shaped blade having a uniform thickness. The cutting blade 59 is formed by bonding diamond abrasive grains with a bond. The cutting blade 59 is mounted on a spindle (not depicted) at its front end. While the cutting blade 59 is worn in cutting the wiring substrate 11, the sectional shape (thickness) of the cutting blade 59 is uniform unlike the V blade 39, so that a groove having a fixed width can be formed by the cutting blade 59.

Thereafter, the cutting blade 59 is lowered to the depth from the upper surface of the wiring substrate 11 to the half of the thickness thereof at the position outside the wiring substrate 11, and the wiring substrate 11 is next fed in a horizontal direction relative to the cutting blade 59. As a result, the wiring substrate 11 is half cut by the cutting blade 59 along the target division line to form the groove 27 on the front side of the wiring substrate 11 along the target division line. Thereafter, the cutting blade 59 is aligned with the next division line adjacent to the above target division line to similarly half cut the wiring substrate 11 along this next division line. This half cutting operation is repeated along all of the other division lines to form a plurality of similar grooves 27 on the upper surface of the wiring substrate 11 along all of the other division lines. Each groove 27 functions as an escape groove for avoiding the contact between the wiring substrate 11 and the V blade 39 (see FIG. 6A) in the V groove forming step to be described later.

As depicted in FIG. 5B, the chip bonding step is performed after performing the wiring substrate groove forming step. In the chip bonding step, a plurality of semiconductor chips 12 are bonded to a plurality of separate regions defined by the plural grooves 27 extending along the plural division lines. More specifically, the electrodes (not depicted) formed on the upper surface of each semiconductor chip 12 are bonded through the wires 19 to the electrodes 18 formed on the upper surface of the wiring substrate 11. That is, one end of each wire 19 is connected to each electrode of the semiconductor chip 12, and the other end of each wire 19 is connected to each electrode 18 of the wiring substrate 11. While such wire bonding is performed in the chip bonding step in this preferred embodiment, flip chip bonding may be performed instead. In the flip chip bonding, the electrodes formed on the lower surface of each semiconductor chip 12 are directly connected to the electrodes formed on the upper surface of the wiring substrate 11.

As depicted in FIG. 5C, the sealed substrate forming step is performed after performing the chip bonding step. In the sealed substrate forming step, the wiring substrate 11 is held on a holding jig 31 in the condition where the front side of the wiring substrate 11 is exposed upward, and a mold 32 having an inlet opening 33 is set so as to cover the front side of the wiring substrate 11. In this condition, a sealing compound 24 is supplied from a nozzle 34 through the inlet opening 33 of the mold 32 to the front side of the wiring substrate 11 until the inside space of the mold 32 is filled with the sealing compound 24. As a result, the plural semiconductor chips 12 are sealed with the sealing compound 24, and the grooves 27 of the wiring substrate 11 are filled with the sealing compound 24. Thereafter, the sealing compound 24 is heated or dried to be cured, thereby forming a resin layer 13 (see FIG. 5D) on the front side of the wiring substrate 11. Thus, the wiring substrate 11 and the resin layer 13 are stacked to form a sealed substrate 15. After performing the sealed substrate forming step, a planarizing step may be performed to planarize the upper surface of the resin layer 13 by grinding.

As depicted in FIG. 5D, the bump forming step is performed after performing the sealed substrate forming step. In the bump forming step, the sealed substrate 15 is inverted and the resin layer 13 of the sealed substrate 15 is held on a holding jig 41 under suction. In this condition, the back side of the wiring substrate 11 is exposed upward and a plurality of bumps 14 are provided on the exposed back side of the wiring substrate 11. The bumps 14 function as terminals or electrodes in mounting each semiconductor package 10 on various substrates. The bumps 14 are formed at predetermined positions according to the wiring patterns of the wiring substrate 11. Since the bumps 14 are formed prior to dividing the sealed substrate 15, possible displacement of the bumps 14 with respect to the sealed substrate 15 can be prevented.

As depicted in FIG. 6A, the V groove forming step is performed after performing the bump forming step. In the V groove forming step, the wiring substrate 11 of the sealed substrate 15 is held by a holding jig 61 for V groove formation. Thereafter, the sealed substrate 15 is cut by using the V blade 39 to a depth from the upper surface of the resin layer 13 to the half of the thickness of the wiring substrate 11, thereby forming a V groove 25 along each division line (i.e., along each groove 27). The holding jig 61 has a holding surface 62 for holding the lower surface of the sealed substrate 15. The holding surface 62 of the holding jig 61 is formed with a plurality of recesses 63 for accommodating the bumps 14 and further formed with a plurality of escape grooves 64 corresponding to the division lines. Each escape groove 64 is formed between any adjacent ones of the plural recesses 63. Each recess 63 is connected through a suction passage to a vacuum source. Accordingly, a vacuum is produced in each recess 63 to hold the sealed substrate 15 on the holding surface 62 of the holding jig 61 under suction.

The V blade 39 is aligned with each division line at a position outside the sealed substrate 15, and the sealed substrate 15 is next fed in a horizontal direction relative to the V blade 39. At this time, the tip of the V blade 39 is relatively inserted into each groove 27 of the wiring substrate 11, thereby avoiding the contact between the V blade 39 and the wiring substrate 11. Accordingly, only the resin layer 13 is cut by the V blade 39, so that the wearing of the V blade 39 can be suppressed and the timing of dressing the V blade 39 can be retarded to extend a blade life. It is sufficient that the V-shaped tip of the V blade 39 can form the V groove 25 on the sealed substrate 15. For example, as depicted in FIG. 3D, the V-shaped tip of the cutting blade 40 may have a flat end.

As depicted in FIG. 6B, the dividing step is performed after performing the V groove forming step. In the dividing step, the sealed substrate 15 (i.e., the wiring substrate 11) is fully cut by a cutting blade 49 in the condition where the wiring substrate 11 of the sealed substrate 15 is held on the holding jig 61 to obtain a plurality of individual bare packages 21 along each division line (i.e., along each V groove 25). At this time, the tip of the cutting blade 49 is allowed to enter each escape groove 64 of the holding jig 61, so that the interference between the cutting blade 49 and the holding jig 61 can be prevented. While the cutting blade 49 is worn in cutting the wiring substrate 11, a vertical cut surface can be obtained because the sectional shape (thickness) of the cutting blade 49 is uniform unlike the V blade 39.

As depicted in FIG. 6C, the shield layer forming step is performed after performing the dividing step. In the shield layer forming step, each bare package 21 is held on a holding jig 51 in the condition where the bumps 14 are accommodated in each recess 53. In this condition, a conductive material is deposited to each bare package 21 from the upper side thereof, thereby forming an electromagnetic shield layer 16 on the upper surface 22 and the side surface 23 of each bare package 21. The conductive material is metal such as copper, titanium, nickel, and gold. Selecting at least one of such metals forms a multilayer film having a thickness of several μm or more as the electromagnetic shield layer 16. The electromagnetic shield layer 16 may be formed by any method such as sputtering, ion plating, spray coating, chemical vapor deposition (CVD), ink jet printing, screen printing, and vacuum lamination.

The side surface 23 of each bare package 23 is inclined so as to be reverse-tapered from the upper surface 22 toward the bottom of each bare package 21, so that the electromagnetic shield layer 16 having a desired thickness can be easily formed not only on the upper surface 22, but also on the side surface 23. Thusly, the upper surface 22 and the side surface 23 of each bare package 21 are covered with the electromagnetic shield layer 16 to manufacture each semiconductor package 10. The electromagnetic shield layer 16 is connected to the ground line 17, so that electromagnetic noise generated in each semiconductor package 10 can be removed through the ground line 17 to the outside of the semiconductor package 10. Accordingly, it is possible to effectively prevent the leakage of electromagnetic noise to any peripheral electronic components about the semiconductor package 10.

While the wiring substrate groove forming step is performed before the chip bonding step in the second preferred embodiment, it is only essential that the wiring substrate groove forming step is to be performed before the sealed substrate forming step. Accordingly, the wiring substrate groove forming step may be performed between the chip bonding step and the sealed substrate forming step. Further, as in the first preferred embodiment, the bump forming step may be performed between the V groove forming step and the dividing step. In this case, the holding jig 61 used in the V groove forming step and the dividing step is not required to have the recesses 63 for accommodating the bumps 14. That is, an existing holding jig can be used instead.

As described above, the semiconductor package manufacturing method according to the second preferred embodiment can exhibit the following effect as similar to that in the first preferred embodiment. The electromagnetic shield layer 16 can be efficiently formed on the upper surface 22 and the side surface 23 of each bare package 21 so as to have a predetermined thickness capable of exhibiting a sufficient shield effect. Further, since only the resin layer 13 is cut by the V blade 39, the wearing of the V blade 39 can be suppressed to thereby extend a blade life.

Figure 7:
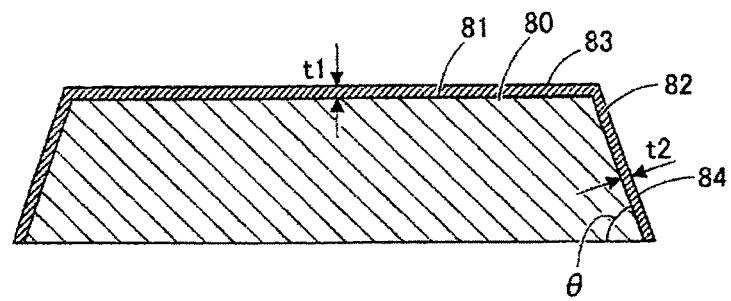
FIG. 7 is a sectional view depicting the thickness of an electromagnetic shield layer formed on a sample.
Figure 8:
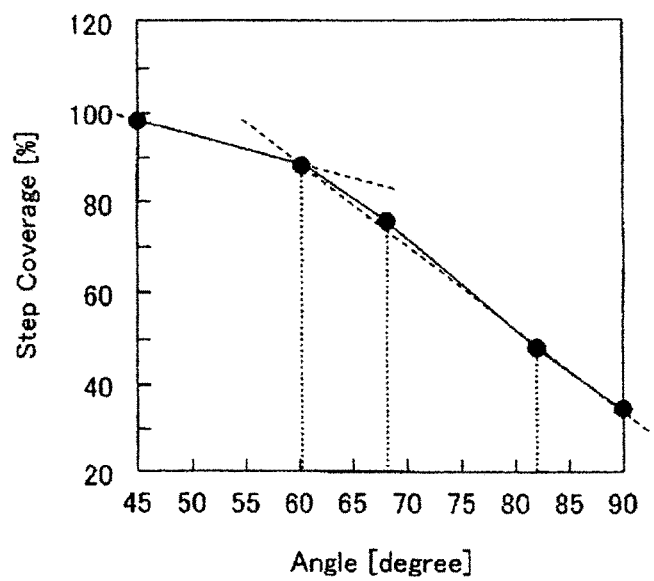
FIG. 8 is a graph depicting the relation between the angle of inclination of the side surface of the sample and the thickness of the electromagnetic shield layer.

There will now be described the relation between the angle of inclination of the side surface 23 of each semiconductor package 10 and the thickness of the electromagnetic shield layer 16. FIG. 7 is a sectional view depicting the thickness of an electromagnetic shield layer formed on a sample. FIG. 8 is a graph depicting the relation between the angle of inclination of the side surface of the sample and the thickness of the electromagnetic shield layer.

As depicted in FIG. 7, reference numeral 80 denotes a sample having an upper surface 81 and a side surface 82. Further, an upper shield layer 83 is formed on the upper surface 81, and a side shield layer 84 is formed on the side surface 82. The side surface 82 is inclined by an angle θ with respect to a horizontal direction. The present inventor performed a test to examine the relation between the angle θ of inclination of the side surface 82 of the sample 80 and the thickness of each shield layer. In this test, a plurality of samples 80 having different inclination angles θ were prepared to form a shield layer by performing an ion plating method at a temperature of 180° C. under a pressure of $8 \times 10^{-4}$ Pa. The angle θ of inclination of the side surface 82 was changed to 90°, 82°, 68°, 60°, and 45°. Further, the upper shield layer 83 formed on the upper surface 81 and the side shield layer 84 formed on the side surface 82 were observed by using a scanning electron microscope, and the thickness t1 of the upper shield layer 83 and the thickness t2 of the side shield layer 84 were measured according to the images obtained by the scanning electron microscope. The thicknesses t1 and t2 of the upper and side shield layers 83 and 84 were used to calculate a step coverage defined below in Eq. (1). FIG. 8 depicts the relation between the step coverage and the inclination angle θ.

$$\text{step coverage} = (t2/t1) \times 100 \tag{1}$$

As apparent from FIG. 8, the step coverage gradually increases with a decrease in the inclination angle θ from 90°, and when the inclination angle θ becomes 45°, the step coverage becomes 100%. More specifically, when the inclination angle θ was set to 45°, the thickness t1 of the upper shield layer 83 was equal to the thickness t2 of the side shield layer 84. That is, it was confirmed that when the inclination angle θ is 45°, the thickness of the electromagnetic shield layer formed on the sample 80 is uniform. Further, when the step coverage becomes less than 50%, much time is required to form the side shield layer 84, resulting in an increase in process cost. Accordingly, the step coverage is preferably set to 50% or more. That is, the inclination angle θ of the side surface 23 of each semiconductor package 10 is preferably set to 45° to 82°. In this case, the angle of the tip of the V blade 39 is 90° or less and 36° or more.

Figure 9A:
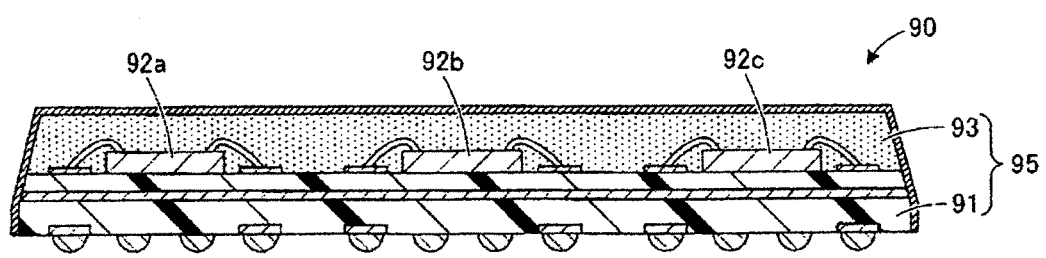
FIGS. 9A and 9B are schematic sectional views depicting modifications of the semiconductor package in the present invention.

While each semiconductor package 10 includes the single semiconductor chip 12 mounted on the wiring substrate 11 in the first and second preferred embodiments, a plurality of semiconductor chips may be mounted on a wiring substrate in each semiconductor package. For example, FIG. 9A depicts a configuration such that a plurality of (e.g., three) semiconductor chips 92a, 92b, and 92c are mounted on a wiring substrate 91 and these semiconductor chips 92a, 92b, and 92c are collectively shielded to manufacture a semiconductor package 90. In this case, V grooves are formed on a sealed substrate 95 so as to separate a plurality of packages from each other in the V groove forming step, and the sealed substrate 95 is next divided along these V grooves on a package-by-package basis in the dividing step. These semiconductor chips 92a, 92b, and 92c may have the same function or may have different functions.

Figure 9B:
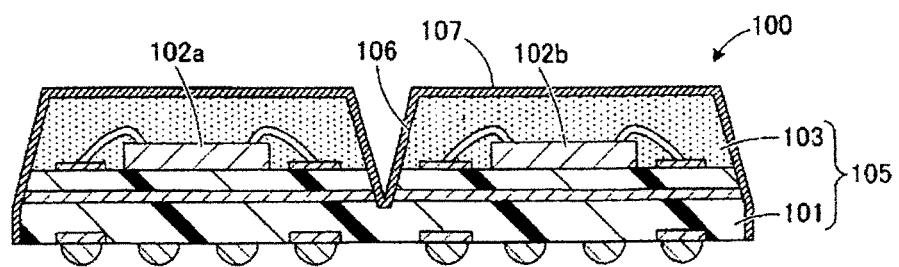

FIG. 9B depicts another configuration such that a plurality of (e.g., two) semiconductor chips 102a and 102b are mounted on a wiring substrate 101 and these semiconductor chips 102a and 102b are separately shielded to manufacture a semiconductor package (system in package (SiP)) 100. In this case, V grooves 106 are formed on a sealed substrate 105 so as to separate a plurality of semiconductor chips from each other in the V groove forming step, and the sealed substrate 105 is next divided along some of the V grooves 106 on a package-by-package basis in the dividing step. With this configuration, an electromagnetic shield layer 107 is formed between the semiconductor chips 102a and 102b, so that the influence of electromagnetic noise can be prevented between the semiconductor chips 102a and 102b. The semiconductor chips 102a and 102b may have the same function or may have different functions.

Figure 10A:
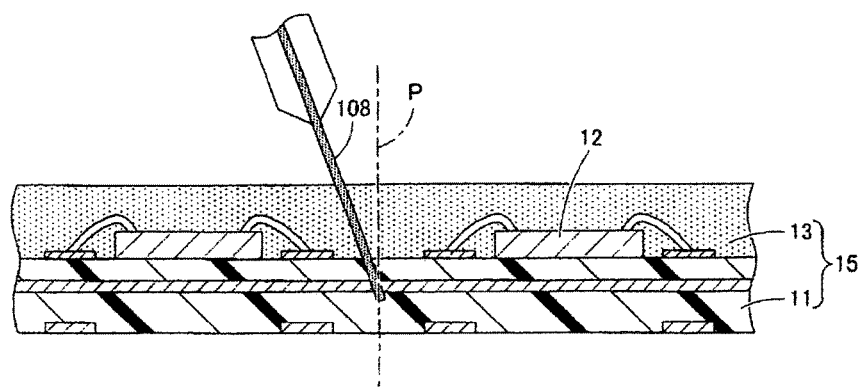
FIGS. 10A to 10C are schematic sectional views depicting modifications of the V groove forming step in the present invention.

While the V blade 39 is used as a processing tool in the V groove forming step in the first and second preferred embodiments, the V groove forming step may be performed by using any tool capable of forming a V groove on the sealed substrate to the depth from the upper surface of the resin layer to the half of the thickness of the wiring substrate. For example, FIG. 10A depicts a configuration such that a usual cutting blade 108 is used as a processing tool to form a V groove on the sealed substrate 15. More specifically, the cutting blade 108 is inclined by a predetermined angle to one side with respect to a vertical plane P along each division line set on the sealed substrate 15. In this condition, the sealed substrate 15 is cut by the cutting blade 108 inclined to one side. Thereafter, the cutting blade 108 is inclined by the above predetermined angle to the other side with respect to the vertical plane P. In this condition, the sealed substrate 15 is cut by the cutting blade 108 inclined to the other side. Accordingly, the upper surface of the sealed substrate 15 is cut away by the cutting blade 108 to form a V groove along each division line.

Figure 10B:
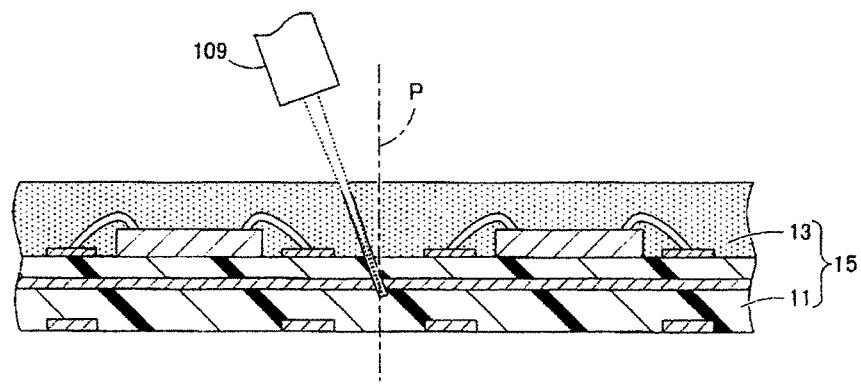

FIG. 10B depicts another configuration such that a processing head 109 for laser ablation is used as a processing tool to form a V groove on the sealed substrate 15. More specifically, the processing head 109 is inclined by a predetermined angle to one side with respect to a vertical plane P along each division line set on the sealed substrate 15. In this condition, the sealed substrate 15 is cut by a laser beam applied from the processing head 108 inclined to one side. Thereafter, the processing head 109 is inclined by the above predetermined angle to the other side with respect to the vertical plane P. In this condition, the sealed substrate 15 is cut by the laser beam applied from the processing head 109 inclined to the other end. The laser beam has an absorption wavelength to the sealed substrate 15 to thereby effect the laser ablation to the sealed substrate 15. Accordingly, the upper surface of the sealed substrate 15 is cut away by the laser beam to form a V groove along each division line. The term of laser ablation used herein means a phenomenon such that when the intensity of a laser beam applied becomes equal to or greater than a predetermined processing threshold, the energy of the laser beam is converted into electronic, thermal, photoscientific, and mechanical energy on the surface of a solid, so that neutral atoms, molecules, positive and negative ions, radicals, clusters, electrons, and light are explosively emitted and the solid surface is etched.

Figure 10C:
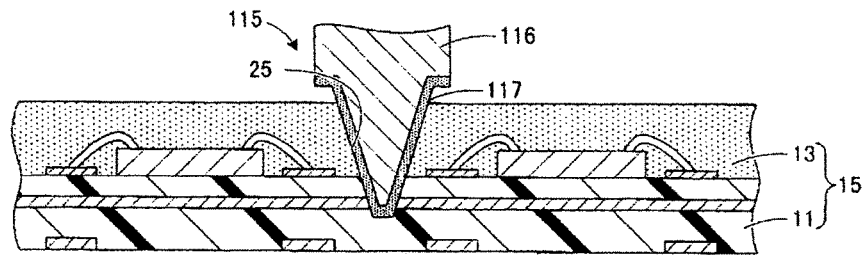

FIG. 10C depicts another configuration such that a profiler 115 is used as a processing tool to form a V groove 25 on the sealed substrate 15. The profiler 115 includes an aluminum base 116 having a substantially V-shaped working surface and an abrasive layer 117 formed on the working surface of the aluminum base 116 by electrodeposition, wherein the abrasive layer 117 contains diamond abrasive grains. The profiler 115 is more resistant to wearing than the V blade 39, so that the V shape of the profiler 115 can be maintained for a long period of time.

While the cutting blade 49 is used to perform the dividing step in the first and second preferred embodiments, the dividing step may be performed by using any tool capable of dividing the sealed substrate into individual bare packages. For example, laser ablation may be adopted to divide the sealed substrate into individual bare packages.

While the wiring substrate 11 is held on each holding jig to perform each step in the first and second preferred embodiments, this configuration is merely illustrative. For example, a protective tape may be attached to the back side of the wiring substrate 11, and the wiring substrate 11 may be placed through the protective tape on a base or the like to perform each step. Any holding means capable of holding a substrate may be used as the holding jig. For example, a chuck table having a porous holding surface may be suitably used as the holding jig. The semiconductor package is applicable not only to mobile communication equipment such as mobile phone, but also to any other electronic equipment such as camera.

Figure 11:
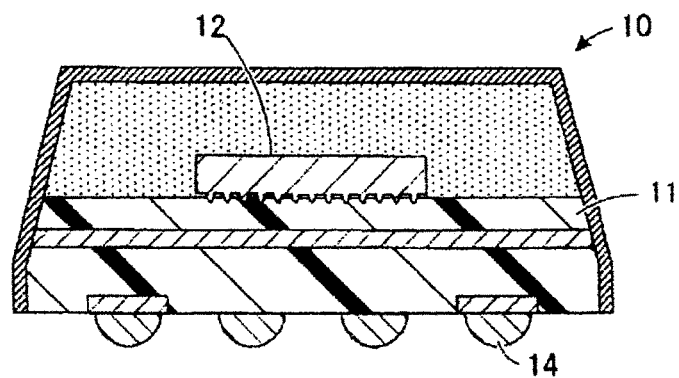
FIG. 11 is a schematic sectional view depicting another modification of the semiconductor package in the present invention.

While each semiconductor chip is bonded through the wires to the electrodes of the wiring substrate by wire bonding to manufacture each semiconductor package in the first and second preferred embodiments and various modifications, this configuration is merely illustrative. For example, FIG. 11 depicts another configuration such that the semiconductor chip 12 is directly connected to the electrodes of the wiring substrate 11 by flip chip bonding to obtain the semiconductor package 10. Further, the first and second preferred embodiments and various modifications may be combined generally or partially to perform other preferred embodiments.

The present invention is not limited to the above preferred embodiments and modifications mentioned above, but various other modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

Further, while the present invention is applied to a semiconductor package manufacturing method in the above description, the present invention is also applicable to a manufacturing method for any other packaged components, each of which is formed with a shield layer having a predetermined thickness.

As described above, the present invention has an effect such that a shield layer having a predetermined thickness can be efficiently formed on the side surface of each bare package. In particular, the present invention is useful for a manufacturing method for a semiconductor package to be used in mobile communication equipment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor package manufacturing method for manufacturing a plurality of semiconductor packages, comprising:
    a chip bonding step of bonding a plurality of semiconductor chips to a plurality of separate regions on a front side of a wiring substrate, said separate regions being defined by a plurality of crossing division lines;
    a sealed substrate forming step of supplying a sealing compound to the front side of said wiring substrate after performing said chip bonding step, thereby forming a resin layer from said sealing compound on the front side of said wiring substrate to obtain a sealed substrate including said wiring substrate and said resin layer, in which said semiconductor chips are sealed;
    a V groove forming step of holding said wiring substrate of said sealed substrate on a holding jig after performing said sealed substrate forming step, and next cutting said sealed substrate along each division line by using a processing tool to a depth from an upper surface of said resin layer to the half of the thickness of said wiring substrate, thereby forming a V groove on a front side of said sealed substrate along each division line, said V groove having a side surface inclined with respect to a vertical direction so as to extend from the upper surface of said resin layer to the bottom of said V groove;
    an inverting step of inverting said wiring substrate such that said front side of said sealed substrate faces the holding jig, wherein said inverting step is performed after said V groove forming step;
    a dividing step of dividing said wiring substrate along each V groove after performing said V groove forming step, thereby dividing said sealed substrate along each division line to obtain a plurality of individual bare packages, wherein said dividing step is performed after said inverting step; and
    a shield layer forming step of forming an electromagnetic shield layer on the upper surface and the inclined side surface of each bare package after performing said dividing step, thereby obtaining said plurality of semiconductor packages.

2. A semiconductor package manufacturing method for manufacturing a plurality of semiconductor packages, comprising:
    a chip bonding step of bonding a plurality of semiconductor chips to a plurality or separate regions on a front side of a wiring substrate, said separate regions being defined by a plurality of crossing division lines;
    a sealed substrate forming step of supplying a sealing compound to the front side of said wiring substrate after performing said chip bonding step, thereby forming a resin layer from said sealing compound on the front side of said wiring substrate to obtain a sealed substrate including said wiring substrate and said resin layer, in which said semiconductor chips are sealed;
    a V groove forming step of holding said wiring substrate of said sealed substrate on a holding jig after performing said sealed substrate forming step, and next cutting said sealed substrate along each division line by using a processing tool to a depth from an upper surface of said resin layer to the half of the thickness of said wiring substrate, thereby forming a V groove on a front side of said sealed substrate along each division line, said V groove having a side surface inclined with respect to a vertical direction so as to extend from the upper surface of said resin layer to the bottom of said V groove;
    a dividing step of dividing said wiring substrate along each V groove after performing said V groove forming step, thereby dividing said sealed substrate along each division line to obtain a plurality of individual bare packages:
    a shield layer forming step of forming, an electromagnetic shield layer on the upper surface and the inclined side surface of each bare package after performing said dividing step, thereby obtaining said plurality of semiconductor packages:
    a bump forming step of forming bumps on a back side of said wiring substrate between said V groove forming step and said dividing step;
    said resin layer of said sealed substrate being held on a holding jig under suction in said dividing step.

3. A semiconductor package manufacturing method for manufacturing a plurality of semiconductor packages, comprising:
    a chip bonding step of bonding a plurality of semiconductor chips to a plurality of separate regions on a front side of a wiring substrate, said separate regions being defined by a plurality of crossing division lines;
    a sealed substrate forming step of supplying a sealing compound to the front side of said wiring substrate after performing said chip bonding step, thereby forming a resin layer from said sealing compound on the front side of said wiring substrate to obtain a sealed substrate including said wiring substrate and said resin layer, in which said semiconductor chips are sealed;
    a V groove forming step of holding said wiring substrate of said sealed substrate on a holding jig after performing said sealed substrate forming step, and next cutting said sealed substrate along each division line by using a processing tool to a depth from an upper surface of said resin layer to the half of the thickness of said wiring substrate, thereby forming a V groove on a front side of said sealed substrate along each division line, said V groove having a side surface inclined with respect to a vertical direction, so as to extend from the upper surface of said resin layer to the bottom of said V groove:

a dividing step of dividing said wiring substrate along each V groove after performing said V groove forming step, thereby dividing said sealed substrate along each division line to obtain a plurality of individual bare packages;

a shield layer forming step of forming an electromagnetic shield layer on the upper surface and the inclined side surface of each bare package after performing said dividing step, thereby obtaining said plurality of semiconductor packages;

a wiring substrate groove forming step of forming a groove on the front side of said wiring substrate along each division line before performing said sealed substrate forming step, said groove having a depth from an upper surface of said wiring substrate to the half of the thickness of said wiring substrate;

said sealed substrate being formed in a condition where each groove of said wiring substrate is filled with said sealing compound in said sealed substrate forming step;

said resin layer formed from said sealing compound filling each groove of said wiring substrate being processed by said processing tool to thereby form each V groove in said V groove forming step.

* * * * *

UNITED STATES PATENT AND TRADEMARK OFFICE
CERTIFICATE OF CORRECTION

PATENT NO. : 10,211,164 B2
APPLICATION NO. : 15/845803
DATED : February 19, 2019
INVENTOR(S) : Youngsuk Kim, Byeongdeck Jang and Fumio Uchida It is certified that error appears in the above-identified patent and that said Letters Patent is hereby corrected as shown below:

In the Claims

Column 16, Line 8, delete "or" and insert --of--

Column 16, Line 34, delete "packages:" and insert --packages;--

Column 16, Line 35, delete "forming," and insert --forming--

Column 16, Line 39, delete "packages:" and insert --packages;--

Column 17, Line 1, delete "direction," and insert --direction--

Column 17, Line 3, delete "groove:" and insert --groove;--

Signed and Sealed this
Nineteenth Day of May, 2020

Andrei Iancu
*Director of the United States Patent and Trademark Office*